US008664090B1

(12) United States Patent
Nangalia et al.

(10) Patent No.: US 8,664,090 B1
(45) Date of Patent: Mar. 4, 2014

(54) ELECTRONIC COMPONENT PACKAGE FABRICATION METHOD

(75) Inventors: Sundeep Nand Nangalia, Raleigh, NC (US); Richard Raymond Green, Durham, NC (US); Dean Alan Zehnder, Hillsborough, NC (US); Robert Lanzone, Chandler, AZ (US)

(73) Assignee: Amkor Technology, Inc.

( * ) Notice: Subject to any disclaimer, the term of this patent is extended or adjusted under 35 U.S.C. 154(b) by 39 days.

(21) Appl. No.: 13/447,650

(22) Filed: Apr. 16, 2012

(51) Int. Cl.
*H01L 21/46* (2006.01)
*H01L 21/78* (2006.01)
*H01L 21/301* (2006.01)

(52) U.S. Cl.
USPC ........... 438/462; 438/637; 438/667; 257/737; 257/738

(58) Field of Classification Search
USPC .................................. 438/462, 637, 667, 675
See application file for complete search history.

(56) References Cited

U.S. PATENT DOCUMENTS

| | | | |
|---|---|---|---|
| 5,464,794 A | 11/1995 | Lur et al. | |
| 6,410,414 B1 | 6/2002 | Lee | |
| 6,455,408 B1 | 9/2002 | Hwang et al. | |
| 6,620,633 B2 | 9/2003 | Hembree et al. | |
| 6,809,415 B2 | 10/2004 | Tsukada et al. | |
| 6,835,595 B1 | 12/2004 | Suzuki et al. | |
| 7,023,088 B2 | 4/2006 | Suzuki et al. | |
| 7,157,363 B2 | 1/2007 | Suzuki et al. | |
| 7,183,645 B2 | 2/2007 | Kurosawa et al. | |
| 7,205,660 B2 | 4/2007 | Park et al. | |
| 7,435,781 B2 | 10/2008 | Dharmarajan et al. | |
| 8,058,726 B1 | 11/2011 | Jin et al. | |
| 8,341,835 B1 * | 1/2013 | Huemoeller et al. | ........... 29/841 |
| 2001/0025414 A1 | 10/2001 | Toyoshima et al. | |
| 2002/0076913 A1 | 6/2002 | Lee | |
| 2003/0062336 A1 | 4/2003 | Restaino et al. | |
| 2003/0214038 A1 | 11/2003 | Nemoto | |
| 2004/0203181 A1 | 10/2004 | Shang et al. | |
| 2006/0038291 A1 | 2/2006 | Chung et al. | |
| 2007/0176290 A1 | 8/2007 | Park et al. | |
| 2007/0252275 A1 | 11/2007 | Huang et al. | |
| 2007/0290300 A1 | 12/2007 | Kawakami | |
| 2008/0012124 A1 | 1/2008 | Stapleton et al. | |
| 2009/0166859 A1 | 7/2009 | Yuan et al. | |

(Continued)

FOREIGN PATENT DOCUMENTS

JP         2008-218629         9/2008

OTHER PUBLICATIONS

Jin et al., "Semiconductor Device and Manufacturing Method Thereof," U.S. Appl. No. 13/274,877, filed Oct. 17, 2011.

(Continued)

*Primary Examiner* — Phuc Dang
(74) *Attorney, Agent, or Firm* — McAndrews, Held & Malloy, Ltd.

(57) ABSTRACT

A method includes forming a first buildup dielectric layer on a wafer. The wafer includes electronic components delineated from one another by singulation streets. A singulation street exposure light trap layer is formed on the singulation streets. A second buildup dielectric layer is applied and patterned by being selectively exposed to an exposure light. The singulation street exposure light trap layer traps and diffuses the exposure light thus preventing the exposure light from being reflected to the portion of the second buildup dielectric layer above the singulation streets. In this manner, complete removal of the second buildup dielectric layer above the singulation streets is insured.

19 Claims, 10 Drawing Sheets

(56) References Cited

U.S. PATENT DOCUMENTS

| 2010/0075493 | A1 | 3/2010 | Ishikawa et al. |
| 2011/0204528 | A1 | 8/2011 | Matsutani et al. |
| 2011/0229822 | A1 | 9/2011 | Stapleton |
| 2013/0062761 | A1 | 3/2013 | Lin et al. |
| 2013/0187269 | A1 | 7/2013 | Lin et al. |

OTHER PUBLICATIONS

Nangalia et al., "Electronic Component Package Fabrication Method and Structure," U.S. Appl. No. 13/327,440, filed Dec. 15, 2011.

Anderson et al., "Advances in WLCSP Technologies for Growing Market Needs," Proceedings of SMTA's 6$^{th}$ Annual International Wafer Level Packaging Conference, Oct. 27-30, 2009, 6 pages, Santa Clara, CA.

Stapleton et al., "Reliability of 400 µm Pitch WLCSP Assemblies with Solder Supporting Material," IWLPC Conference Proceedings, Oct. 30, 2009, pp. 168-171.

Stapleton, "Wafer Level Packaging: A Materials Roadmap," IMAPS Chandler, Aug. 2009, 21 pages.

No author provided, "Fujikura Wafer Level Chip Sized Package (WLCSP) Design Guide", May 16, 2001, Rev. 1.4e, 14 pages.

No author provided, "Wafer-Applied Underfill, Lord Scientist Featured by IMAPS," Lord Corporation News Center, 1 page [online], Retrieved on Nov. 3, 2011 from the Internet: <URL:http://www.lord.com/news-center/news-stories/wafer-applied-underfill-lord-scientist-featured-by-imaps.xml>.

No author provided, "Lord Corporation's Stapleton to Speak at International Wafer-Level Packaging Conference," Lord Corporation News Center, 1 page [online], Retrieved on Nov. 3, 2011 from the Internet: <URL:http://www.lord.com/news-center/press-releases/lord-corporations-stapleton-to-speak-at-international-wafer-level-packaging-conference.xml>.

Nangalia et al., "Electronic Component Package Fabrication Method and Structure," U.S. Appl. No. 13/765,388, filed Feb. 12, 2013.

\* cited by examiner

ELECTRONIC COMPONENT PACKAGE FABRICATION METHOD

TECHNICAL FIELD

The present application relates to the field of electronics, and more particularly, to methods of forming electronic component packages and related structures.

BACKGROUND

In a typical Wafer Level Chip Scale Package (WLCSP), the pattern of bond pads on the active surfaces of a wafer are redistributed to a pattern of interconnection balls, sometimes called solder balls or a Ball Grid Array (BGA), for electrical connection to other structures. The wafer is then singulated by cutting the wafer along singulation streets.

BRIEF DESCRIPTION OF THE DRAWINGS

In the following description, the same or similar elements are labeled with the same or similar reference numbers.

DETAILED DESCRIPTION

Figure 3:
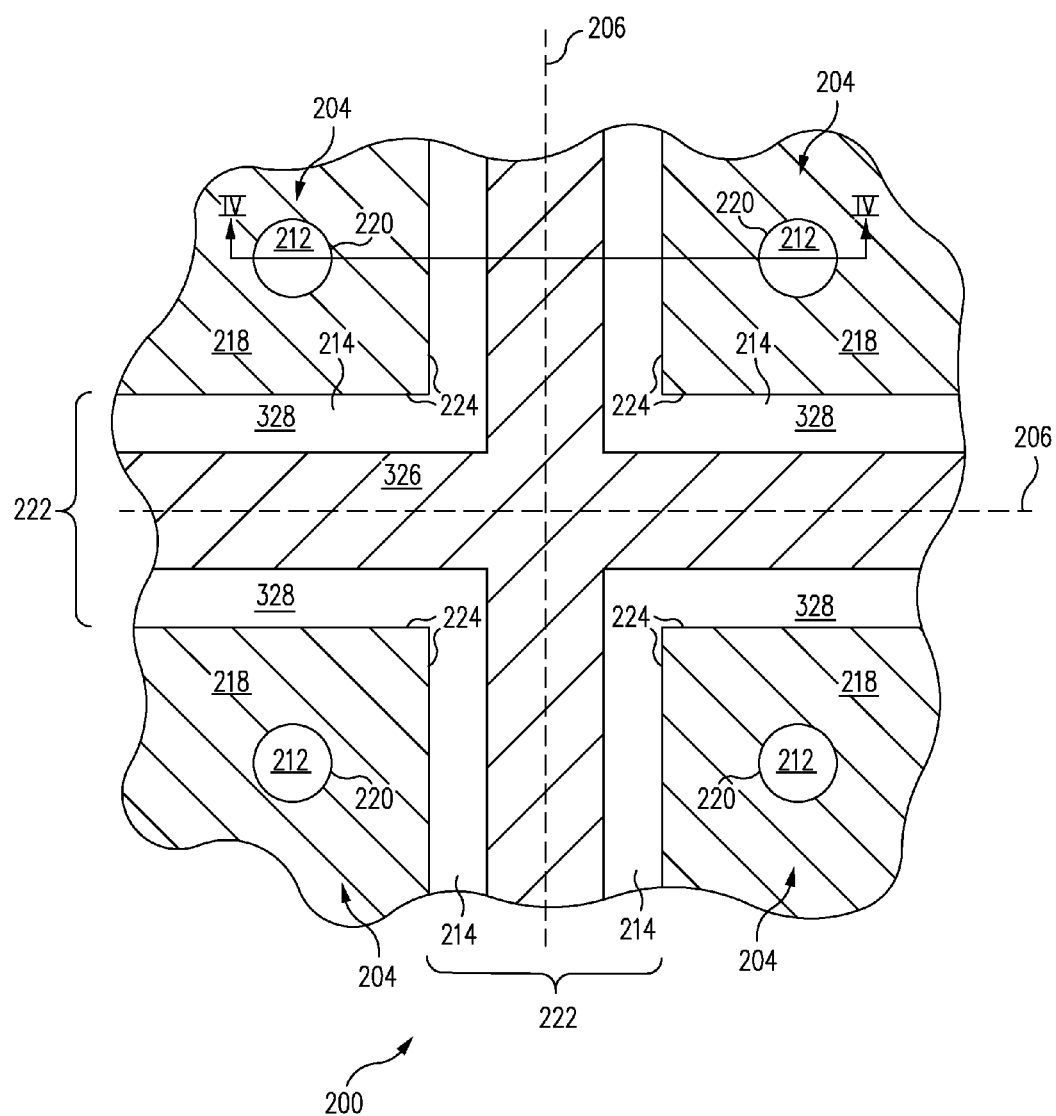
FIG. 3 is a top plan view of the assembly of FIG. 2 at a later stage during fabrication in accordance with one embodiment.
Figure 4:
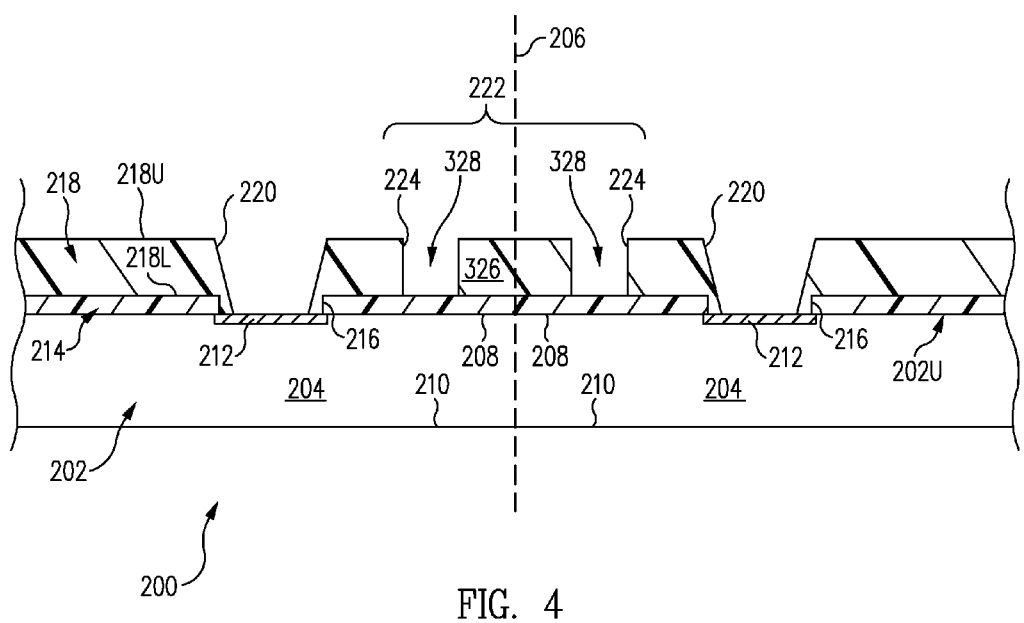
FIG. 4 is a cross-sectional view of the assembly of FIG. 3 along the line IV-IV in accordance with one embodiment.

As an overview and in accordance with one embodiment, referring to FIGS. 3 and 4 together, a method includes forming a first buildup dielectric layer 218 on a wafer 202. Wafer 202 includes electronic components 204 delineated from one another by singulation streets 206. A singulation street exposure light trap layer 326 is formed on singulation streets 206.

Figure 7:
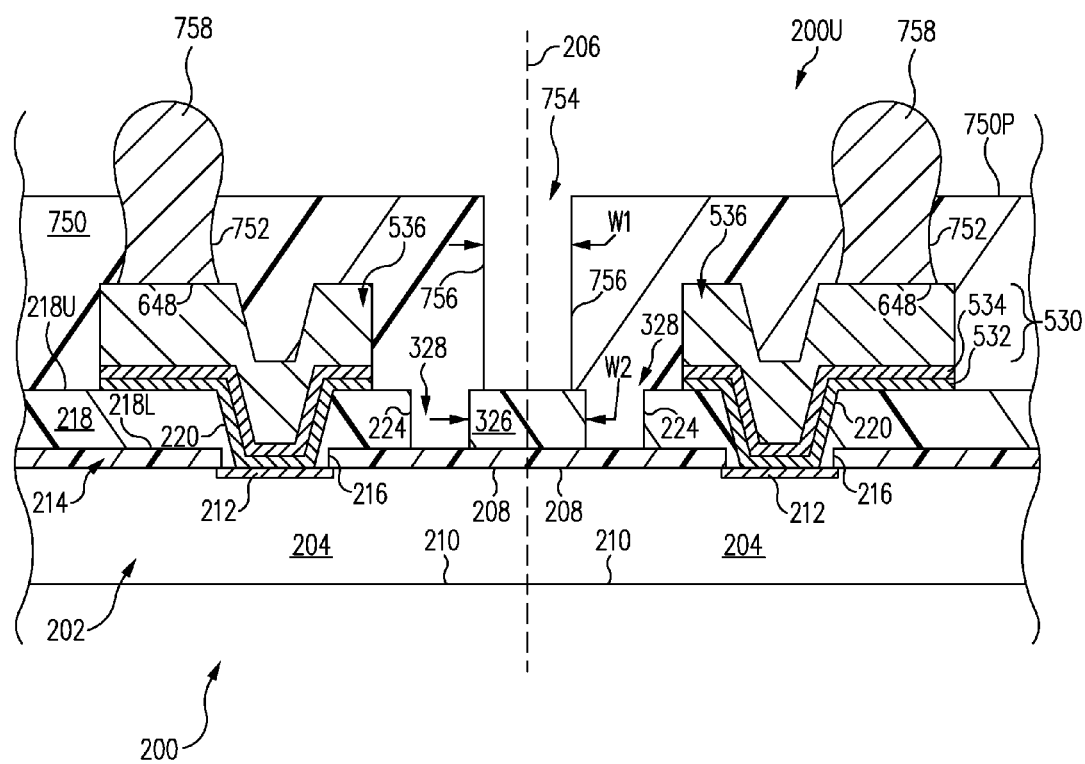

Referring now to FIG. 7, a second buildup dielectric layer 750 is applied and patterned by being selectively exposed to an exposure light to form singulation street trenches 754 in second buildup dielectric layer 750.

Singulation street exposure light trap layer 326 traps and diffuses the exposure light thus preventing the exposure light from being reflected to the portion of second buildup dielectric layer 750 above singulation streets 206. In this manner, complete removal of the portion of second buildup dielectric layer 750 above singulation streets 206 is insured.

Figure 1:
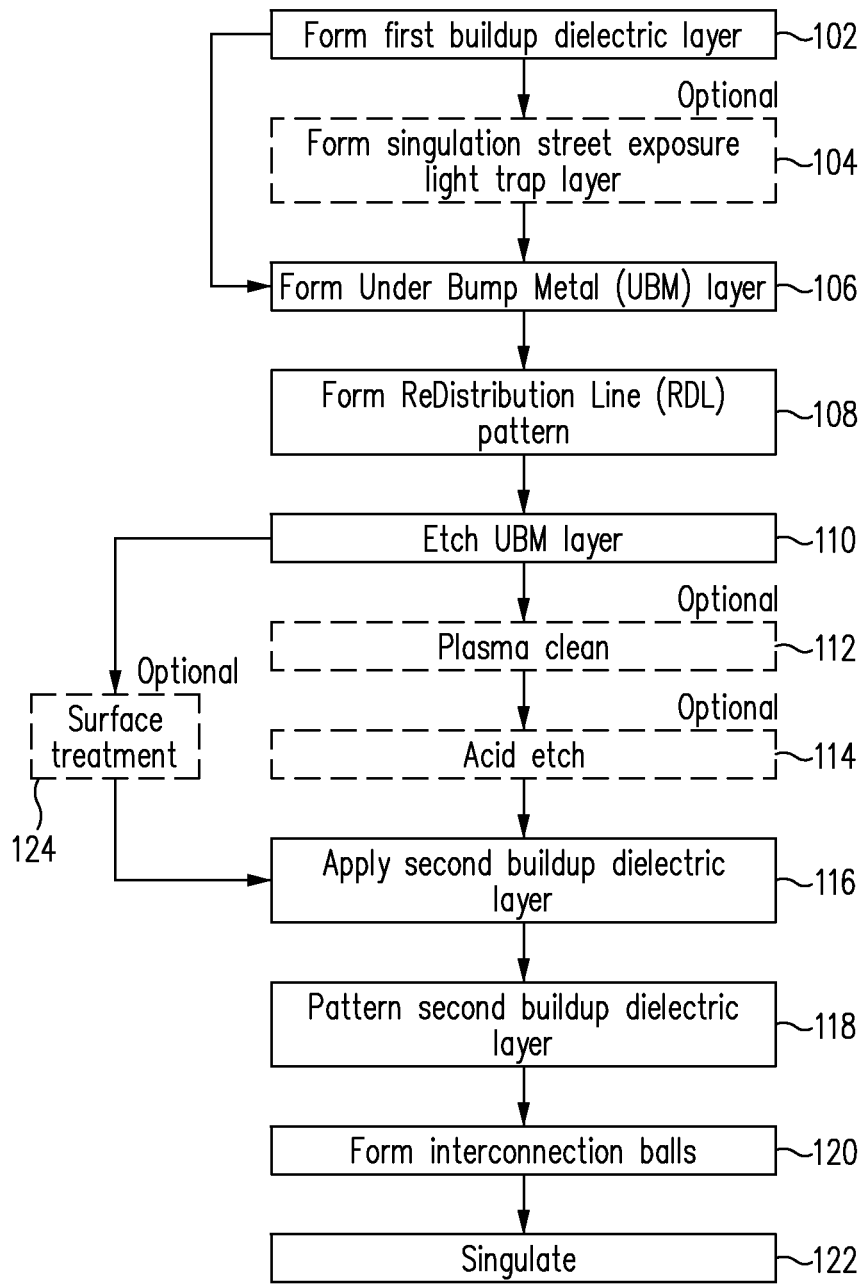
FIG. 1 is a block diagram of an electronic component package fabrication method in accordance with one embodiment.
Figure 2:
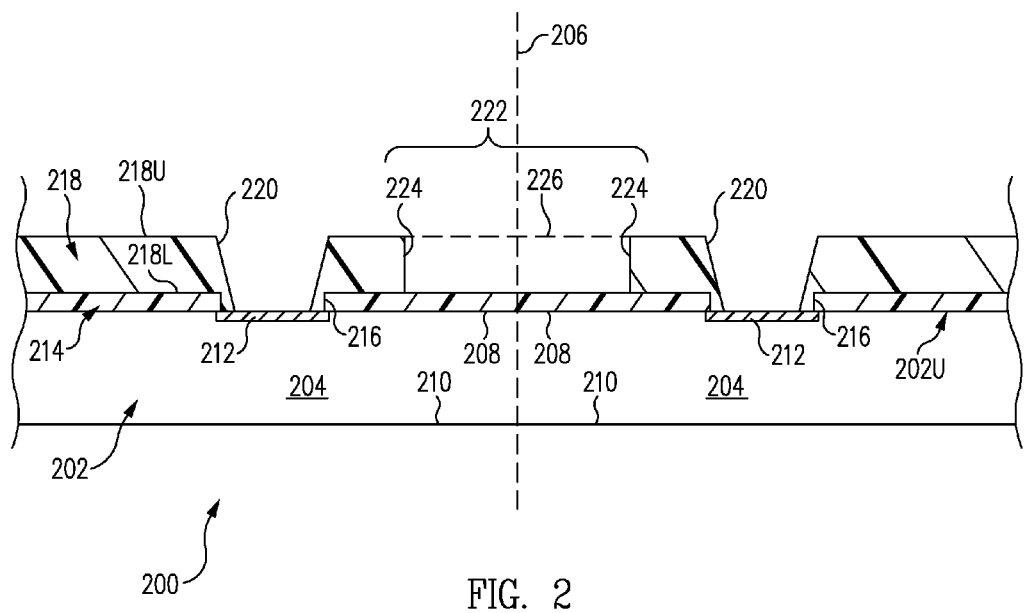
FIG. 2 is a cross-sectional view of an assembly including a wafer in accordance with one embodiment.

Now in more detail, FIG. 1 is a block diagram of an electronic component package fabrication method 100 in accordance with one embodiment. FIG. 2 is a cross-sectional view of an assembly 200 including a wafer 202 in accordance with one embodiment.

Referring now to FIGS. 1 and 2 together, wafer 202, sometimes called a substrate, e.g., a silicon wafer, includes a plurality of electronic components 204 integrally connected together. Electronic components 204 are delineated from one another by singulation streets 206.

Singulation streets 206 are the regions between electronic components 204 where wafer 202 will be cut, sometimes called singulated, at final stages of assembly. Singulation streets 206 are typically a checker board type structure including intersecting vertical and horizontal lines. Although thin lines are used to represent singulation streets 206, singulation streets have width, e.g., varying between 80 µm and 120 µm, but have smaller or greater widths in other embodiments depending upon the particular application.

In one embodiment, electronic components 204 are integrated circuit chips, e.g., active components. However, in other embodiments, electronic components 204 are passive components such as capacitors, resistors, or inductors.

In accordance with this embodiment, electronic components 204 include active surfaces 208 and opposite inactive surfaces 210. Electronic components 204 further include bond pads 212 formed on active surfaces 208. Although only a single bond pad 212 for each electronic component 204 is illustrated in the figures, in light of this disclosure, those of skill in the art will understand that each electronic component 204 includes a plurality of bond pads 212 which are redistributed to a pattern of interconnection balls as discussed below.

Bond pads 212, e.g., copper or aluminum pads, form the input/output (I/O) terminals for electronic components 204. Bond pads 212 are the finished and outermost I/O terminals for electronic components 204 in their final form as would be provided from the manufacturer of electronic components 204. Stated another way, bond pads 212 are the I/O terminals of wafer 202 as finished from the wafer manufacturer.

In accordance with one embodiment, bond pads 212 are distributed in an edge array. More particularly, bond pads 212 are distributed upon active surfaces 208 adjacent singulation streets 206. In another embodiments, bond pads 212 are distributed in an area array, i.e., are distributed in an array throughout active surfaces 208 including the central regions of active surfaces 208.

In one embodiment, active surfaces 208 include a dielectric passivation layer 214 thereon as wafer 202 is finished from the wafer manufacturer. Passivation layer 214 has passivation layer bond pad apertures 216 that expose bond pads 212.

In form first buildup dielectric layer operation 102, a first buildup dielectric layer 218 is formed on active surfaces 208 of electronic components 204 and more specifically on passivation layer 214.

In one embodiment, a dielectric material is applied to passivation layer 214. More generally, a dielectric material is applied to active surfaces 208 of electronic components 204 and even more generally to an active, e.g., first, surface 202U of wafer 202. The dielectric material fills passivation layer bond pad apertures 216 in passivation layer 214 and covers singulation streets 206.

In one embodiment, the dielectric material is polyimide (PI) or polybenzoxazole(PBO) that is applied using a spin on process.

The dielectric material is then patterned, i.e., selectively removed, to form first buildup dielectric layer bond pad apertures 220 therein. Each first buildup dielectric layer bond pad aperture 220 extends entirely through first buildup dielectric layer 218 and through passivation layer 214, i.e., through a passivation layer bond pad aperture 216, to a respective bond pad 212. Accordingly, bond pads 212 are exposed through first buildup dielectric layer bond pad apertures 220.

As illustrated in FIG. 1, passivation layer 214 and first buildup dielectric layer 218 slightly overlap and cover the outer peripheries of bond pads 212 such that the central regions on bond pads 212 are exposed through first buildup dielectric layer bond pad openings 220.

The dielectric material is further patterned to selectively remove the dielectric material from singulation streets 206 to form singulation street channels 222 in the dielectric material. Singulation street channels 222 extend entirely through first buildup dielectric layer 218 to expose singulation streets 206. More particularly, singulation street channels 222 expose passivation layer 214 above singulation streets 206. In one embodiment, singulation street channels 222 are a checker board type structure including intersecting vertical and horizontal channels corresponding to singulation streets 206.

Singulation street channels 222 are defined by singulation street channel sidewalls 224 of first buildup dielectric layer 218 and passivation layer 214. Singulation street channel sidewalls 224 extend perpendicularly between a lower, e.g., first, surface 218L of first buildup dielectric layer 218 and an upper, e.g., second surface 218U of first buildup dielectric layer 218.

Although various features may be described herein as being perpendicular, parallel, or having other relations, it is to be understood that the features may not be exactly perpendicular or parallel, but only substantially perpendicular or parallel to within accepted manufacturing tolerances.

Although passivation layer 214 and first buildup dielectric layer 218 are illustrated in the figures, in another embodiment, passivation layer 214 is not formed. In accordance with this embodiment, first buildup dielectric layer 218 is formed directly on active surfaces 208 of electronic components 204. Accordingly, singulation street channels 222 expose active surface 202U of wafer 202, e.g., silicon, in accordance with this embodiment.

In another embodiment, singulation street channels 222 are not formed. In accordance with this embodiment, upper surface 218U of first buildup dielectric layer 218 is indicated by the dashed line 226 in FIG. 2 to illustrate that first buildup dielectric layer 218 is not removed from, but covers, singulation streets 206. First buildup dielectric layer 218 covers singulation streets 206 and operates in a manner similar to the singulation street exposure light trap layer to enhance removal of a second buildup dielectric layer from above singulation streets 206 as described below.

FIG. 3 is a top plan view of assembly 200 of FIG. 2 at a later stage during fabrication in accordance with one embodiment. FIG. 4 is a cross-sectional view of assembly 200 of FIG. 3 along the line IV-IV in accordance with one embodiment.

From form first buildup dielectric layer operation 102, flow moves to a form singulation street exposure light trap layer operation 104. In form singulation street exposure light trap layer operation 104, a singulation street exposure light trap layer 326 is formed in singulation street channels 222 and on singulation streets 206.

Singulation street exposure light trap layer 326 is isolated from and does not directly contact first buildup dielectric layer 218. More particularly, singulation street exposure light trap layer 326 is formed on passivation layer 214 (or directly on upper surface 202U of wafer 202 if passivation layer 214 is not formed) between but separated from singulation street channel sidewalls 224. Accordingly, spaces 328 exist between singulation street exposure light trap layer 326 and first buildup dielectric layer 218.

In one embodiment, singulation street exposure light trap layer 326 is formed of a dielectric material, e.g., a polymer passivation material such as PI or PBO, but is formed of other materials in other embodiments. Further, although singulation street exposure light trap layer 326 is illustrated as having the same thickness in the vertical direction in the view of FIG. 4 as first buildup dielectric layer 218, in other embodiments, singulation street exposure light trap layer 326 is thicker or thinner than first buildup dielectric layer 218.

Further, although operations 102, 104 are set forth as separate operations, in one embodiment, operations 102, 104 are performed simultaneously. For example, a dielectric material is applied and patterned in a single operation to form both first buildup dielectric bond pad apertures 220 and spaces 328. In accordance with this embodiment, first buildup dielectric layer 218 and singulation street exposure light trap layer 326 are separate portions of the applied single dielectric material.

Figure 5:
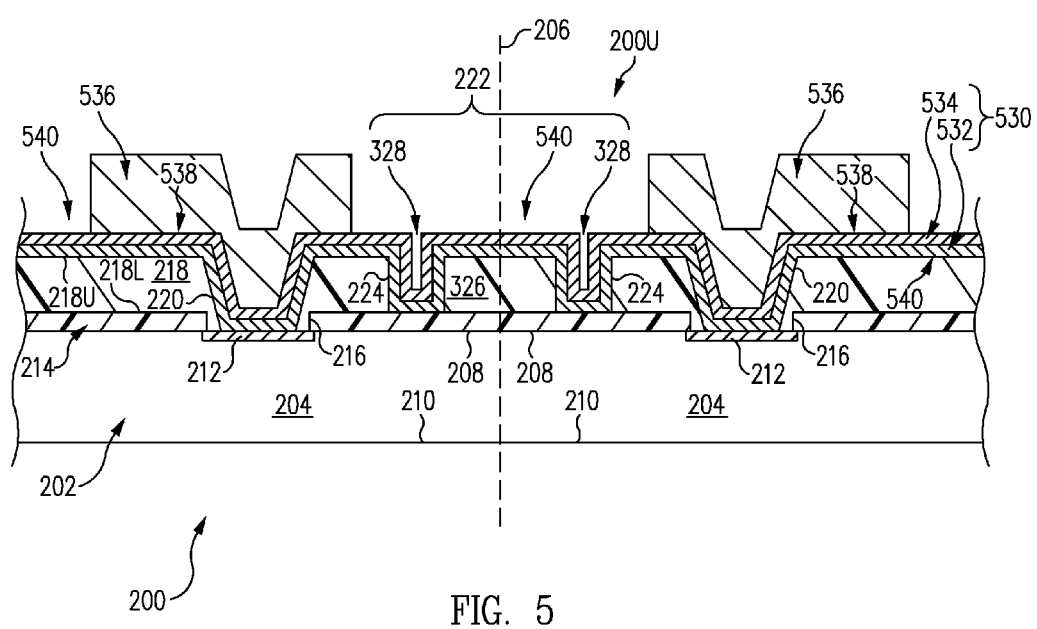
FIGS. 5, 6, 7, 8 are cross-sectional views of the assembly of FIG. 4 at later stages during fabrication in accordance with various embodiments.

FIG. 5 is a cross-sectional view of assembly 200 of FIG. 4 at a later stage during fabrication in accordance with one embodiment. Referring now to FIGS. 1 and 5 together, from form singulation street exposure light trap layer operation 104, flow moves to a form Under Bump Metal (UBM) layer operation 106. In form UBM layer operation 106, a UBM layer 530 is formed.

UBM layer 530 includes a bi-layer structure including a first UBM layer 532 and a second UBM layer 534. First UBM layer 532 covers the entire upper surface 200U of assembly 200. Second UBM layer 534 is formed on first UBM layer 532.

In one embodiment, first UBM layer 532 is titanium tungsten (TiW) or titanium (Ti) and second UBM layer 534 is copper. Illustratively, first UBM layer 532 and second UBM layer 534 are seed layers, e.g., that are blanket deposited by sputtering.

From form UBM layer operation 106, flow moves to a form ReDistribution Line (RDL) pattern operation 108. In form RDL pattern operation 108, a redistribution pattern 536, sometimes called an RDL pattern 536, is formed. Redistribution pattern 536 is formed of an electrically conductive material, e.g., copper.

In accordance with this embodiment, redistribution pattern 536 is formed on second UBM layer 534. In one embodiment, to form redistribution pattern 536, a patterned resist is formed on second UBM layer 534. Redistribution pattern 536, e.g., copper, is selectively plated on second UBM layer 534 using the patterned resist as a mask. The resist is removed resulting in assembly 200 as illustrated in FIG. 5.

Although particular materials for UBM layers 532, 534, and redistribution pattern 536 are set forth, in light of this disclosure, those of skill in the art will understand that UBM layers 532, 534, and redistribution pattern 536 are formed of other materials in other embodiments.

As illustrated, redistribution pattern 536 is plated on and covers first covered portions 538 of UBM layers 532, 534. However, second exposed portions 540 of UBM layers 532, 534 are exposed from redistribution pattern 536.

Figure 6:
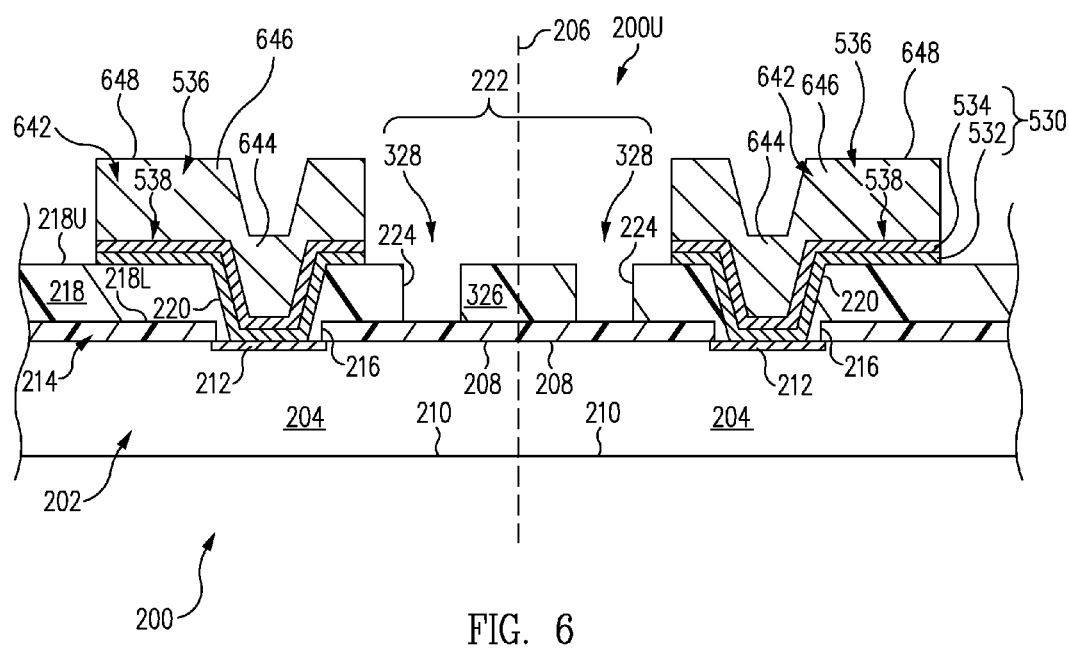

FIG. 6 is a cross-sectional view of assembly 200 of FIG. 5 at a later stage during fabrication in accordance with one embodiment. Referring now to FIGS. 1, 5, and 6 together, from form RDL pattern operation 108, flow moves to an etch UBM layer operation 110. In etch UBM layer operation 110, exposed portions 540 of UBM layers 532, 534 are removed, e.g., by etching, using redistribution pattern 536 as a mask.

Covered portions 538 of UBM layers 532, 534 are not removed and remain below redistribution pattern 536. Although UBM layers 532, 534 and redistribution pattern 536 are discussed above and illustrated, in other embodiments, UBM layer 532 and/or UBM layer 534 are not formed. Note that in the following discussion, redistribution pattern 536 is discussed without reference to covered portions 538 of UBM layers 532, 534. However, it is to be understood that covered portions 538 of UBM layers 532, 534 may exist depending upon the embodiment.

Redistribution pattern 536 includes a pattern of electrically conductive signal lines 642. Signal lines 642 include bond pad vias 644, traces 646, and redistribution pattern terminals 648. Although only a single signal line 642 is illustrated for each electronic component 204, in light of this disclosure, those of skill in the art will understand that redistribution pattern 536 includes a plurality of signal lines 642 depending upon the particular input/output and redistribution desired.

Bond pad vias 644 are within and extend through first buildup dielectric layer bond pad apertures 220 to contact and be electrically connected to bond pads 212.

Traces 646 are typically long thin electrical conductors having a length much greater than a width. Each trace 646 is electrically connected to a respective bond pad via 644 and thus to a respective bond pad 212 at a first end of the trace 646.

In accordance with this embodiment, each trace 646 terminates (ends) in a redistribution pattern terminal 648. Accordingly, the pattern of bond pads 212 is redistributed to the pattern of redistribution pattern terminals 648 by redistribution pattern 536.

From etch UBM layer operation 110, flow moves to a plasma clean operation 112. In plasma clean operation 112, assembly 200 is cleaned using a plasma. Illustratively, residue and/or other contaminants on assembly 200 are removed by plasma cleaning.

From plasma clean operation 112, flow moves to an acid etch operation 114. In acid etch operation 114, assembly 200 is further cleaned using an acid etch. Illustratively, residue and/or other contaminants on assembly 200 are removed by acid etching. In one particular embodiment, assembly 200 is etched using acetic acid.

FIG. 7 is a cross-sectional view of assembly 200 of FIG. 6 at a later stage during fabrication in accordance with one embodiment. Referring now to FIGS. 1 and 7 together, from acid etch operation 114, flow moves to an apply second buildup dielectric layer operation 116. In apply second buildup dielectric layer operation 116, a second buildup dielectric layer 750 is applied.

Second buildup dielectric layer 750 is applied to redistribution pattern 536, singulation street exposure light trap layer 326, and the exposed surfaces of passivation layer 214 and first buildup dielectric layer 218.

Second buildup dielectric layer 750 is a dielectric material. In one particular embodiment, second buildup dielectric layer 750 has the properties as listed in Table 1.

TABLE 1

| | |
|---|---|
| Tensile strength | 38.9 MPa |
| Modulus | 6.0 GPa (25° C.) |
| | 720 MPa (250° C.) |
| Elongation | 100% |
| Residual Stress | 24 MPa |
| Coefficient of Thermal Expansion (CTE) | 15 ppm (25° C.) |
| | 29 ppm (240° C.) |
| Glass Transition Temperature (Tg) | 120° C. |
| 1% Weight Loss Temperature | 360° C. |
| 5% Weight Loss Temperature | 410° C. |
| Volume Resistivity | >1.0 × E15 |
| Dielectric Constant | 3.5 |
| Dissipation Factor | 0.032 (@1 GHz) |
| Breakdown Voltage | 335 V/μm |
| Cure Temperature | 150-200° C. |
| Moisture Update | <1.0% |

In one embodiment, the elongation is the percentage that second buildup dielectric layer 750 stretches before second buildup dielectric layer 750 breaks. For a 100% elongation as listed in Table 1, second buildup dielectric layer 750 stretches to double its length before second buildup dielectric layer 750 breaks.

Further, the cure temperature is the temperature at which second buildup dielectric layer 750 cures. For a cure temperature of 150-200° C. as listed in Table 1, second buildup dielectric layer 750 cures at a temperature in the range of 150-200° C.

In one particular embodiment, second buildup dielectric layer 750 includes 70% inorganic filler, e.g., silica, and 30% binder, e.g., epoxy, although includes other components in other embodiments. A suitable material for second buildup dielectric layer 750 includes the Solderbrace™ material manufactured by the Lord Corporation headquartered in Cary, N.C.

In one embodiment, second buildup dielectric layer 750 is blanket applied by screen printing on the entire upper surface 200U of assembly 200.

From apply second buildup dielectric layer operation 116, flow moves to a pattern second buildup dielectric layer operation 118. In pattern second buildup dielectric layer operation 118, second buildup dielectric layer 750 is patterned to form redistribution pattern terminal apertures 752 and singulation street trenches 754 therein.

Each redistribution pattern terminal aperture 752 extends entirely through second buildup dielectric layer 750 to a respective redistribution pattern terminal 648 of redistribution pattern 536. Accordingly, redistribution pattern terminals 648 are exposed through redistribution pattern terminal apertures 752.

Singulation street trenches 754 extend entirely through second buildup dielectric layer 750 above singulation streets 206. Accordingly, a portion or all of singulation street exposure light trap layer 326 is exposed through singulation street trenches 754.

In this embodiment, the width W1 of singulation street trenches 754 is less than the width W2 of singulation street exposure light trap layer 326 such that only a portion of singulation street exposure light trap layer 326 is exposed through singulation street trenches 754. However, in another embodiment, width W1 of singulation street trenches 754 is greater than width W2 of singulation street exposure light trap layer 326 such that all of singulation street exposure light trap layer 326 is exposed through singulation street trenches 754.

In one embodiment, singulation street trenches 754 are a checker board type structure including intersecting vertical and horizontal trenches corresponding to singulation streets 206.

Singulation street trenches 754 are defined by singulation street trench sidewalls 756 of second buildup dielectric layer 750 and singulation street exposure light trap layer 326. Singulation street trench sidewalls 756 extend between singulation street exposure light trap layer 326 and a principal surface 750P of second buildup dielectric layer 750.

In one embodiment, second buildup dielectric layer 750 is a photo sensitive material and has photo receptors that are very sensitive to light reflections. To pattern second buildup dielectric layer 750, a mask, e.g., an opaque metal mask, is applied to second buildup dielectric layer 750 over the regions of second buildup dielectric layer 750 to be removed, e.g., above redistribution pattern terminals 648 and singulation streets 206.

Second buildup dielectric layer 750 is light, e.g., UV light, exposed through the mask. The regions of second buildup dielectric layer 750 exposed to the exposure light are polymerized, while the unexposed regions, i.e., the regions above redistribution pattern terminals 648 and singulation streets 206, remain unpolymerized. The mask is then removed.

Singulation street exposure light trap layer 326 traps and diffuses the exposure light thus preventing the exposure light from being reflected (bounce back) to the portion of second buildup dielectric layer 750 above singulation streets 206. This, in turn, prevents partial or complete polymerization of the portion of second buildup dielectric layer 750 above singulation streets 206.

Accordingly, singulation street exposure light trap layer 326 ensures that second buildup dielectric layer 750 remains unpolymerized above singulation streets 206. In this manner, complete removal of the portion of second buildup dielectric layer 750 above singulation streets 206 resulting in the formation of singulation street trenches 754 is insured.

After being exposed to the exposure light, the unpolymerized regions of second buildup dielectric layer 750 are removed resulting in the formation of redistribution pattern terminal apertures 752 and singulation street trenches 754. For example, the unpolymerized regions are removed using a spray of a second buildup dielectric layer removal fluid, e.g., Propylene Glycol Methyl Ether Acetate (PGMEA).

From pattern second buildup dielectric layer operation 118, flow moves to a form interconnection balls operation 120. In form interconnection balls operation 120, interconnection balls 758 are formed within redistribution pattern terminal apertures 752 and on redistribution pattern terminals 648.

In one embodiment, to form interconnection balls 758, flux is applied within redistribution pattern terminal apertures 752 and on redistribution pattern terminals 648. Solder balls are dropped onto the flux. The solder balls are then reflowed, i.e., heated to a melt and resolidified, to form interconnection balls 758.

Figure 8:
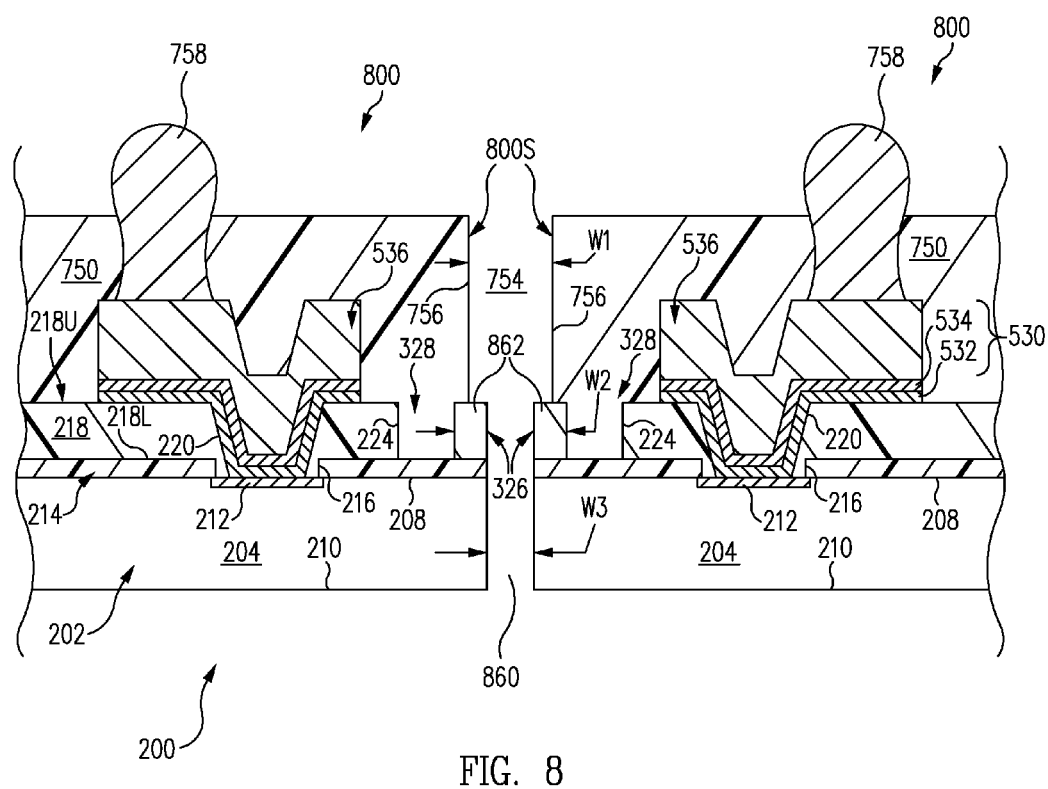

FIG. 8 is a cross-sectional view of assembly 200 of FIG. 7 at a later stage during fabrication in accordance with one embodiment. Referring now to FIGS. 1, 7, and 8 together, from form interconnection balls operation 120, flow moves to a singulate operation 122. In singulate operation 122, assembly 200 is singulated, i.e., cut, along singulation streets 206 to result in a plurality of electronic component packages 800. For example, assembly 200 is singulated using a mechanical saw although can be singulated using other techniques, e.g., a laser, in other embodiments.

In one embodiment, the width W3 of cut 860 is less than the width W2 of singulation street exposure light trap layer 326 such that edge portions 862 of singulation street exposure light trap layer 326 remain in each electronic component package 800 at sides 800S thereof. However, in another embodiment, width W3 of cut 860 is equal to or greater than width W2 of singulation street exposure light trap layer 326 such that singulation street exposure light trap layer 326 is completely removed during singulate operation 122.

As discussed above, singulation street exposure light trap layer 326 is isolated from first buildup dielectric layer 218. Accordingly, should singulation street exposure light trap layer 326 become caught up in the singulation saw and torn, first buildup dielectric layer 218 remains unaffected and undamaged.

Further, in this embodiment, width W3 of cut 860 is less than width W1 of singulation street trenches 754 such that the saw does not contact, or only minimally contacts, second buildup dielectric layer 750 during singulation. This insures clean singulation of assembly 200. However, in other embodiments, width W3 of cut 860 is greater than width W1 of singulation street trenches 754 such that a portion of second buildup dielectric layer 750 gets removed during singulate operation 122.

Figure 9:
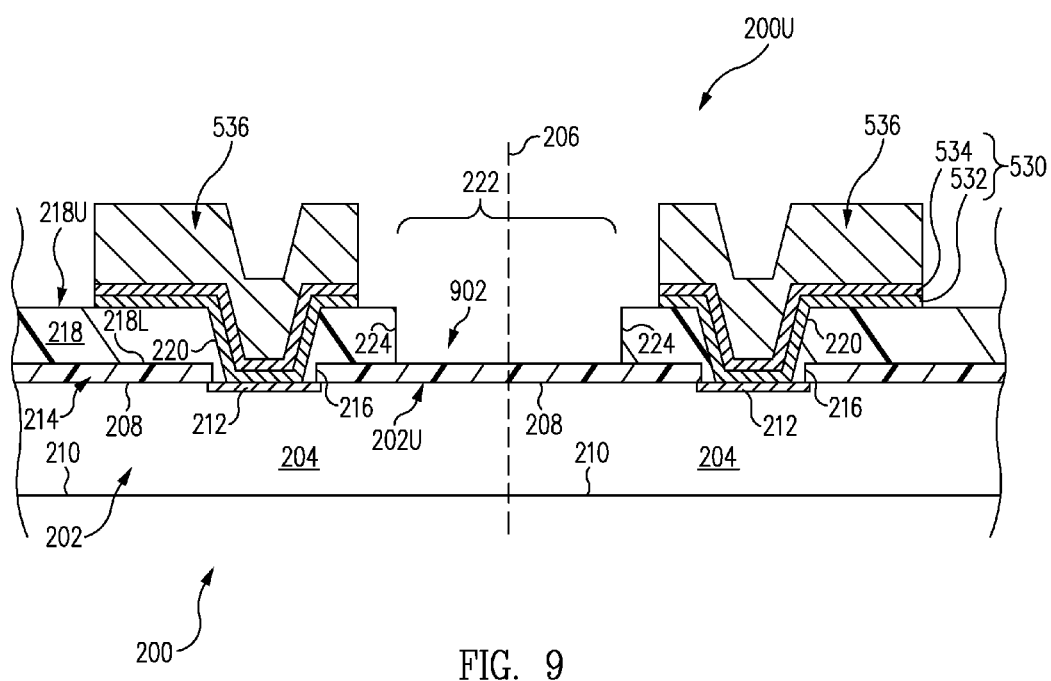
FIG. 9 is a cross-sectional view of the assembly of FIG. 2 at a later stage during fabrication in accordance with another embodiment.

FIG. 9 is a cross-sectional view of assembly 200 of FIG. 2 at a later stage during fabrication in accordance with another embodiment. Referring now to FIGS. 1, 6, and 9 together, assembly 200 as illustrated in FIG. 9 is fabricated in the same or identical manner as assembly 200 as illustrated in FIG. 6 and discussed above with the exception that form singulation street exposure light trap layer operation 104 is not performed. More particularly, flow moves directly from form first buildup dielectric layer operation 102 to form UBM layer operation 106 and form singulation street exposure light trap layer operation 104 is not performed. Thus, form singulation street exposure light trap layer operation 104 is indicated as an optional operation.

Thus, as illustrated in FIG. 9, singulation street exposure light trap layer 326 is not formed. Accordingly, an exposed singulation street region 902 of active surface 202U of wafer 202 is exposed within singulation street channels 222. As used herein, singulation street region 902 is the region of active surface 202U of wafer 202 exposed through singulation street channels 222 although it is to be understood that passivation layer 214 may be on active surface 202U depending upon the embodiment.

Referring now just to FIGS. 1 and 9 together, in this embodiment, from etch UBM layer operation 110, flow moves to a surface treatment operation 124. In surface treatment operation 124, a surface treatment on singulation street region 902 is performed. The surface treatment treats singulation street region 902 to reduce adherence of and enhance removal of second buildup dielectric layer 750 from singulation street region 902 as further discussed and illustrated below in reference to FIG. 10.

In one embodiment, the surface treatment includes treating singulation street region 902 by spinning on cyclopentanone and/or hexamethyldisilazane.

In one specific embodiment, the surface treatment includes omitting plasma clean operation 112 and acid etch operation 114. In accordance with this embodiment, flow moves directly from etch UBM layer operation 110 directly to apply second buildup dielectric layer operation 116.

Accordingly, plasma clean operation 112 and acid etch operation 114 are indicated as optional operations. Further, as the surface treatment is the omission of plasma clean operation 112 and acid etch operation 114, surface treatment operation 124 is also not performed in this embodiment and thus is indicated as an optional operation.

Although surface treatment of singulation street region 902 is discussed above, in one embodiment, the entire upper surface 200U of assembly is surface treated. However, as second buildup dielectric layer 750 adheres well to first buildup dielectric layer 218, second buildup dielectric layer 750 adheres to first buildup dielectric layer 218 even though first buildup dielectric layer 218 has been surface treated.

Figure 10:
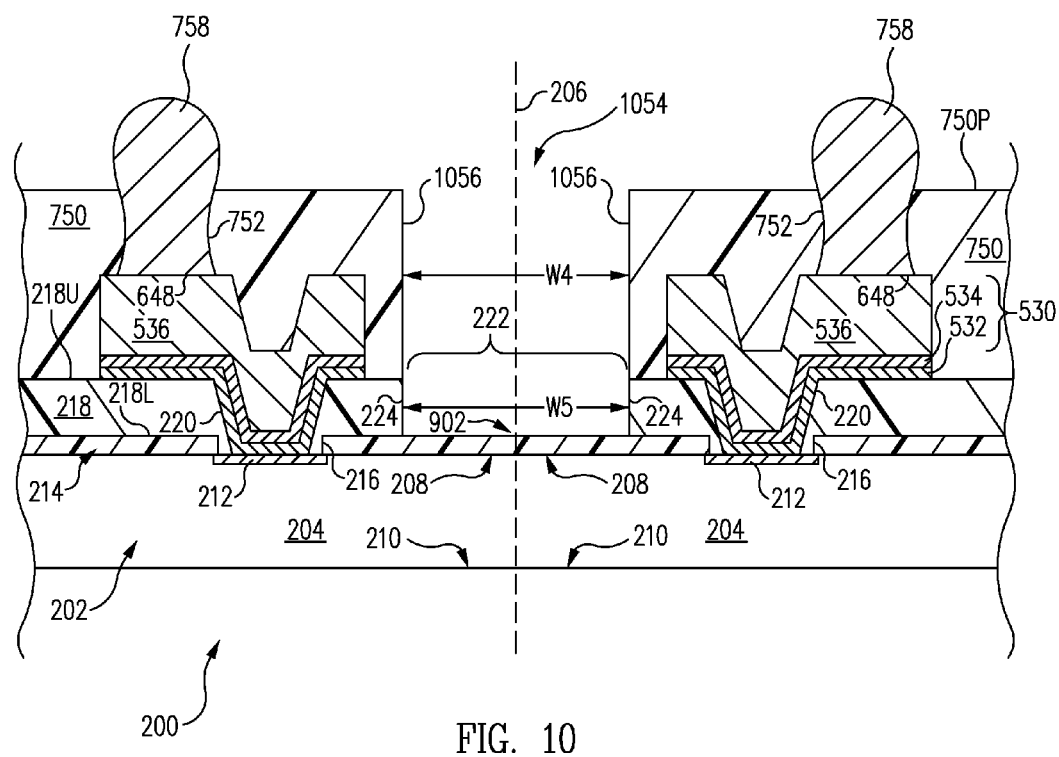
FIG. 10 is a cross-sectional view of the assembly of FIG. 9 at a later stage during fabrication in accordance with one embodiment.

FIG. 10 is a cross-sectional view of assembly 200 of FIG. 9 at a later stage during fabrication in accordance with one embodiment. Referring now to FIGS. 1, 9, and 10 together, in apply second buildup dielectric layer operation 116, second buildup dielectric layer 750 is applied as discussed above.

From apply second buildup dielectric layer operation 116, second buildup dielectric layer 750 is patterned in pattern second buildup dielectric layer operation 118 as discussed above. In this embodiment, there may be some polymerization of second buildup dielectric layer 750 above singulation street region 902 during the light exposure due to reflection of the exposure light.

However, singulation street region 902 has been surface treated to reduce adherence of and enhance removal of second buildup dielectric layer 750 as described above. Accordingly, second buildup dielectric layer 750 is completely removed above singulation street region 902 resulting in the formation of singulation street trenches 1054. As discussed above, second buildup dielectric layer 750 adheres well and thus is not removed from first buildup dielectric layer 218 regardless of whether or not first buildup dielectric layer 218 was surface treated.

Singulation street trenches 1054 extend entirely through second buildup dielectric layer 750 above singulation streets 206. In this embodiment, singulation street region 902 is entirely exposed through singulation street trenches 1054. Stated another way, the width W4 of singulation street trenches 1054 is approximately equal to the width W5 of singulation street channels 222 in first buildup dielectric layer 218.

However, in another embodiment, width W4 of singulation street trenches 1054 is less than width W5 of singulation street channels 222 such that the edge portions of singulation street region 902 are covered by second buildup dielectric layer 750. In yet another embodiment, width W4 of singulation street trenches 1054 is greater than width W5 of singulation street channels 222 such that the edge portions of first buildup dielectric layer 218 are exposed through singulation street trenches 1054.

In one embodiment, singulation street trenches 1054 are a checker board type structure including intersecting vertical and horizontal trenches corresponding to singulation streets 206.

Singulation street trenches 1054 are defined by singulation street trench sidewalls 1056 of second buildup dielectric layer 750 and singulation street region 902. Singulation street channel sidewalls 1056 extend between first buildup dielectric layer (or singulation street region 902 depending upon the embodiment) and principal surface 750P of second buildup dielectric layer 750.

From pattern second buildup dielectric layer operation 118, flow moves to form interconnection balls operation 120, which is performed as discussed above. From form interconnection balls operation 120, flow moves to singulate operation 122, which is performed as discussed above.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A method comprising:
   forming a first buildup dielectric layer coupled to a substrate, the substrate comprising electronic components delineated from one another by singulation streets, wherein the forming a first buildup dielectric layer further comprises selectively removing the first buildup dielectric layer from the singulation streets; and
   forming a singulation street exposure light trap layer coupled to the singulation streets, the singulation street exposure light trap layer being spaced apart from the first buildup dielectric layer.

2. The method of claim 1 wherein the selectively removing forms singulation street channels in the first buildup dielectric layer.

3. The method of claim 2 wherein the singulation street exposure light trap layer is formed in the singulation street channels.

4. The method of claim 1 wherein spaces exist between the first buildup dielectric layer and the singulation street exposure light trap layer.

5. The method of claim 1 wherein the forming the first buildup dielectric layer further comprising forming first buildup dielectric layer bond pad apertures in the first buildup dielectric layer to expose bond pads of the electronic components.

6. A method comprising:
   forming a first buildup dielectric layer coupled to a substrate, the substrate comprising electronic components delineated from one another by singulation streets, wherein the forming the first buildup dielectric layer further comprises forming first buildup dielectric layer bond pad apertures in the first buildup dielectric layer to expose bond pads of the electronic components;
   forming a singulation street exposure light trap layer coupled to the singulation streets, the singulation street exposure light trap layer being spaced apart from the first buildup dielectric layer; and
   forming a redistribution line (RDL) pattern on the first buildup dielectric layer and coupled to the bond pads.

7. The method of claim 6 further comprising:
   forming an under bump metal (UBM) layer prior to the forming a RDL pattern; and
   etching the UBM layer using the RDL pattern as a mask.

8. A method comprising:
   forming a first buildup dielectric layer coupled to a substrate, the substrate comprising electronic components delineated from one another by singulation streets;
   forming a singulation street exposure light trap layer coupled to the singulation streets, the singulation street exposure light trap layer being spaced apart from the first buildup dielectric layer;
   applying a second buildup dielectric layer; and
   patterning the second buildup dielectric layer to form singulation street trenches above the singulation streets.

9. The method of claim 8 wherein the patterning comprises:
   forming an opaque mask coupled to the second buildup dielectric layer above the singulation streets; and
   subjecting the second buildup dielectric layer to an exposure light, wherein the singulation street exposure light trap layer traps and diffuses the exposure light at the singulation streets.

10. The method of claim 9 wherein the singulation street exposure light trap layer prevents the exposure light from being reflected to the portion of the second buildup dielectric layer above the singulation streets.

11. The method of claim 8 further comprising singulating the substrate along the singulation streets to form electronic component packages.

12. The method of claim 11 wherein the electronic component packages comprise edge portions of the singulation street exposure light trap layer.

13. A method comprising:
   providing a substrate comprising electronic components delineated from one other by singulation streets;
   forming singulation street channels in a first buildup dielectric layer coupled to the substrate, the singulation street channels exposing a singulation street region of the substrate at the singulation streets; and
   surface treating the singulation street region to reduce adherence of a second buildup dielectric layer to the singulation street region.

14. The method of claim 13 further comprising:
forming an under bump metal (UBM) layer coupled to the first buildup dielectric layer;
forming a redistribution line (RDL) pattern coupled to the UBM layer; and
etching the UBM layer using the RDL pattern as a mask.

15. The method of claim 14 wherein the surface treating comprises applying the second buildup dielectric layer directly after the etching.

16. The method of claim 13 further comprising:
applying the second buildup dielectric layer to the substrate; and
removing the second buildup dielectric from the singulation street region.

17. A method comprising:
providing a substrate comprising electronic components delineated from one another by singulation streets;
forming a first buildup dielectric layer coupled to the substrate comprising forming first buildup dielectric layer bond pad apertures in the first buildup dielectric layer to expose bond pads of the electronic components, wherein the first buildup dielectric layer covers the singulation streets;
applying a second buildup dielectric layer to the first buildup dielectric layer;
forming an opaque mask coupled to the second buildup dielectric layer above the singulation streets; and
subjecting the second buildup dielectric layer to an exposure light, wherein the first buildup dielectric layer traps and diffuses the exposure light at the singulation streets.

18. The method of claim 17 further comprising removing the second buildup dielectric layer above the singulation streets to form singulation street trenches in the second buildup dielectric layer.

19. The method of claim 17 further comprising coupling a passivation layer to the substrate, the first buildup dielectric layer being coupled to the passivation layer.

* * * * *